(12) United States Patent
Sivero et al.

(10) Patent No.: US 7,049,880 B2
(45) Date of Patent: *May 23, 2006

(54) HIGH PRECISION DIGITAL-TO-ANALOG CONVERTER WITH OPTIMIZED POWER CONSUMPTION

(75) Inventors: Stefano Sivero, Vergiate (IT); Lorenzo Bedarida, Vimercate (IT); Massimiliano Frulio, Milan (IT)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/119,675

(22) Filed: May 2, 2005

(65) Prior Publication Data

US 2005/0189983 A1   Sep. 1, 2005

Related U.S. Application Data

(63) Continuation of application No. 10/753,273, filed on Jan. 7, 2004, now Pat. No. 6,906,576.

(30) Foreign Application Priority Data

Oct. 7, 2003 (IT) .......................... MI2003A1924

(51) Int. Cl.
  G05F 1/10 (2006.01)
  G05F 3/02 (2006.01)
(52) U.S. Cl. ...................................... 327/536; 327/538
(58) Field of Classification Search ................ 327/536, 327/538
See application file for complete search history.

(56) References Cited

U.S. PATENT DOCUMENTS

| 4,825,142 | A | 4/1989 | Wang .......................... 323/314 |
|---|---|---|---|
| 5,726,944 | A | 3/1998 | Pelley, III et al. .......... 365/226 |
| 5,831,845 | A | 11/1998 | Zhou et al. .................... 363/60 |
| 5,946,258 | A | 8/1999 | Evertt et al. ................. 365/226 |
| 5,963,025 | A | 10/1999 | Colli .......................... 323/288 |
| 6,091,282 | A | 7/2000 | Kim ........................... 327/536 |
| 6,108,246 | A | * | 8/2000 | Umezawa et al. ..... 365/189.09 |

(Continued)

FOREIGN PATENT DOCUMENTS

JP        03158911 A        7/1991

(Continued)

OTHER PUBLICATIONS

G.A. Rincon-Mora, "A Low-Voltage, Low Quiescent Current, Low Drop-Out Regulator", IEEE Journal of Solid-State Circuits, Jan. 1998, vol. 33, No. 1, pp. 36-44.

*Primary Examiner*—Quan Tra
(74) *Attorney, Agent, or Firm*—Schneck & Schneck; Thomas Schneck (57) ABSTRACT

A regulated charge pump circuit having two-way switching means that switches between a first feedback pathway that provides a precise and stable voltage output and a second feedback pathway that provides a regulated voltage output with low current consumption from the power source. The first feedback pathway maintains a precise voltage output by regulating a pass device that draws current to the voltage output. The second feedback pathway regulates the voltage output by controlling the connection of a clock input to the charge pump. A variable resistor is used to set the regulated level of the voltage output. A digital-to analog converter is formed by using a combination logic circuit to convert a digital input signal to a control signal for the variable resistor.

11 Claims, 7 Drawing Sheets

U.S. PATENT DOCUMENTS

| | | | |
|---|---|---|---|
| 6,232,830 B1 | 5/2001 | Fournel | 327/540 |
| 6,259,612 B1 | 7/2001 | Itoh | 363/60 |
| 6,300,820 B1 | 10/2001 | Fotouhi et al. | 327/536 |
| 6,310,789 B1 | 10/2001 | Nebrigic et al. | 363/60 |
| 6,356,499 B1 * | 3/2002 | Banba et al. | 365/226 |
| 6,369,552 B1 | 4/2002 | Goyhenetche et al. | 323/266 |
| 6,448,750 B1 | 9/2002 | Shor et al. | 323/282 |
| 6,518,828 B1 * | 2/2003 | Seo et al. | 327/534 |
| 6,518,830 B1 | 2/2003 | Gariboldi et al. | 327/536 |
| 6,724,241 B1 | 4/2004 | Bedarida et al. | 327/536 |
| 6,794,927 B1 | 9/2004 | Bedarida et al. | 327/536 |
| 6,809,573 B1 * | 10/2004 | Kim | 327/536 |
| 6,876,246 B1 * | 4/2005 | Kim | 327/536 |
| 2002/0171471 A1 | 11/2002 | Perotto et al. | 327/540 |
| 2005/0073355 A1 | 4/2005 | Sivero et al. | 327/536 |

FOREIGN PATENT DOCUMENTS

JP  03158911 A * 7/1991

* cited by examiner

HIGH PRECISION DIGITAL-TO-ANALOG CONVERTER WITH OPTIMIZED POWER CONSUMPTION

CROSS-REFERENCE TO RELATED APPLICATION

This application is a continuation of U.S. patent application Ser. No. 10/753,273 filed Jan. 7, 2004, now U.S. Pat. No. 6,906,576.

TECHNICAL FIELD

The present invention relates to the production of a stable and precise voltage from an unregulated power source, and more particularly, to the regulation of charge pump voltage output ($V_{out}$).

BACKGROUND ART

Various solutions exist to regulate an output voltage of an unregulated power source, such as a charge pump, to provide a stable and steady output voltage. Some solutions are based on systems that compare the charge pump output voltage with a reference voltage and then generate an output signal that stops the clock feeding the charge pump when the desired voltage has been reached. However, due to the unavoidable propagation delay of the control loop in stopping the clock and the periodic fluctuation of the output voltage amplitude due to the pumping action, voltage ripples will be observed at the regulated voltage output. Although there are ways to minimize the ripples, they cannot be eliminated completely. As a result, these ripples can present a problem for those applications requiring a very precise voltage source.

Alternatively, a serial regulation scheme, in which a pass device is connected between the unregulated charge pump output and the regulated voltage output, provides a smoother voltage output. The pass device, being controlled by a feedback loop furnished with an error amplifier, sinks an appropriate amount of current in response to the output of the error amplifier, thereby maintaining a stable and precise voltage output. However, current consumption for such devices is high at high voltage output because the error amplifier must be supplied by the charge pump output to properly drive the gate of the pass device. Another source of current consumption is the bias current going through the pass device.

Therefore, it would be desirable to have a voltage regulation system that provides a stable and precise voltage output without the drawback of high current consumption.

DISCLOSURE OF THE INVENTION

The present invention regulates a charge pump output through a selected one of two feedback pathways. A first feedback pathway uses a pass device that sinks an appropriate amount of current from the output of the charge pump so as to provide a stable and precise output voltage. A second feedback pathway regulates the output voltage by controlling the clock input of the charge pump, thereby providing a regulated output voltage with low current consumption. The feedback pathways are selected by ways of a pair of two-way switching means that switches between the two feedback pathways as the demand for output voltage level changes. For a low voltage output with high precision, the first feedback pathway is selected. For a high voltage output with low current consumption, the second feedback pathway is selected.

BEST MODE OF CARRYING OUT THE INVENTION

Figure 1:
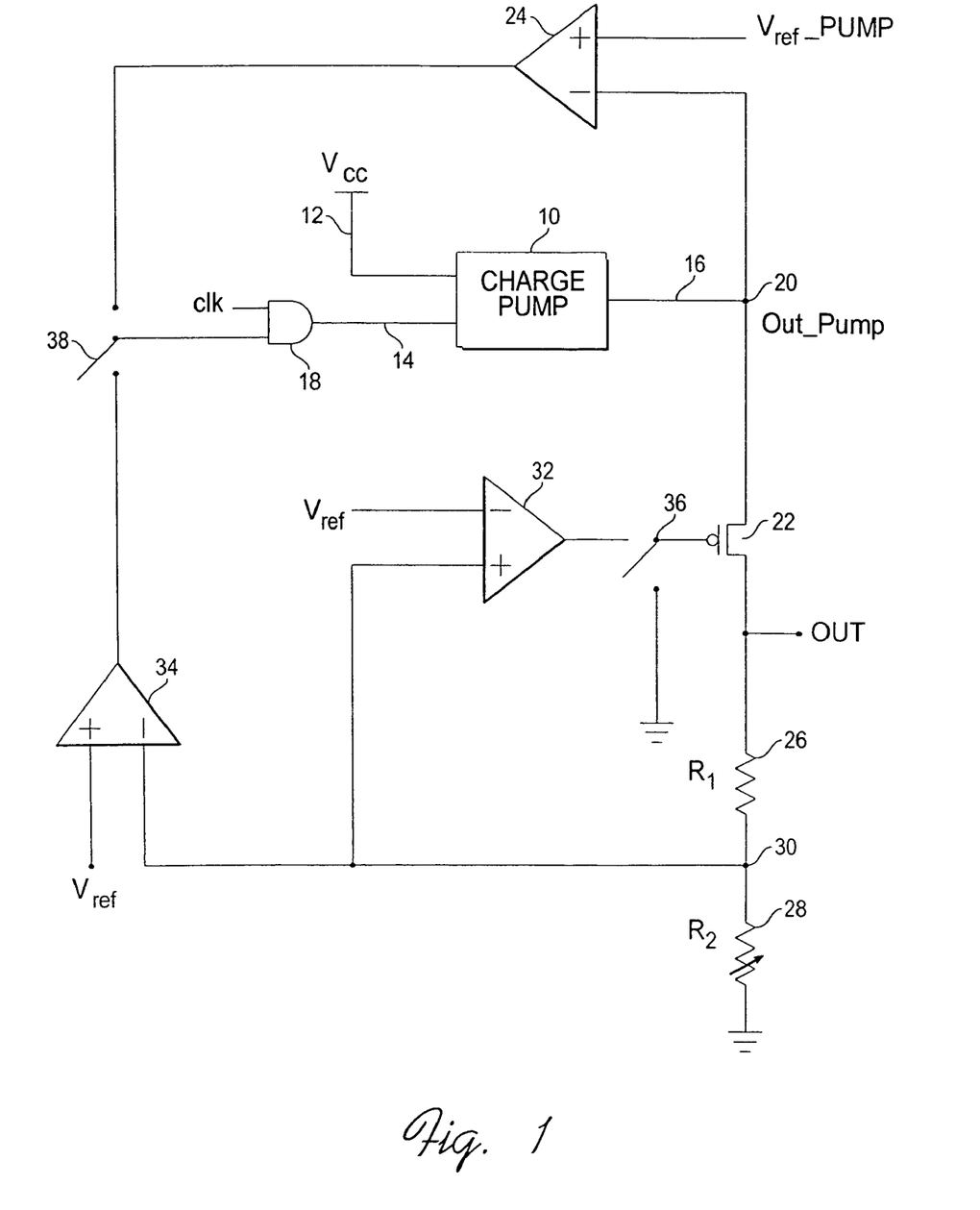
FIG. 1 is a circuit block diagram showing an embodiment of present invention.

In FIG. 1, the present invention is shown to have a charge pump having a first input terminal 12 connected to power supply Vcc, a second input terminal 14 connected to the output terminal of a two-input AND gate 18, one input of which receives a clock signal clk, and an output terminal 16 connected to a OUT_PUMP node 20. The OUT_PUMP node 20 is further connected to the source of a PMOS pass transistor 22 and also to the negative input terminal of a first op amp 24 functioning as a first voltage comparator. The positive input terminal of the first op amp 24 connects to a first reference voltage $V_{ref\_pump}$. The drain of the PMOS transistor 22 connects to an output terminal OUT 33 and to one end of a voltage divider formed by a fixed-value resistor R1 26 and a variable resistor R2 28 connected in a serial manner. The other end of said voltage divider connects to ground. The gate of the PMOS transistor 22 connects to a first two-way switching means 36 that connects the gate of the PMOS transistor 22 either to the output of a second op amp 32 or ground. The center_tap 30 of the voltage divider connects to the positive input terminal of the second op amp 32 and the negative input of a third op amp 34, functioning as respective loop error amplifier and second voltage comparator. The negative input terminal of the second op amp 32 and the positive input terminal of the third op amp 34 connects to a second reference voltage $V_{ref}$. A second two-way switching means 38 connects either the output of the third op amp 34 or the output of the first op amp 24 to a second input terminal of the AND gate 18. The regulated voltage output is taken at the voltage output terminal OUT 33 at the drain of the PMOS transistor 22.

Figure 2A:
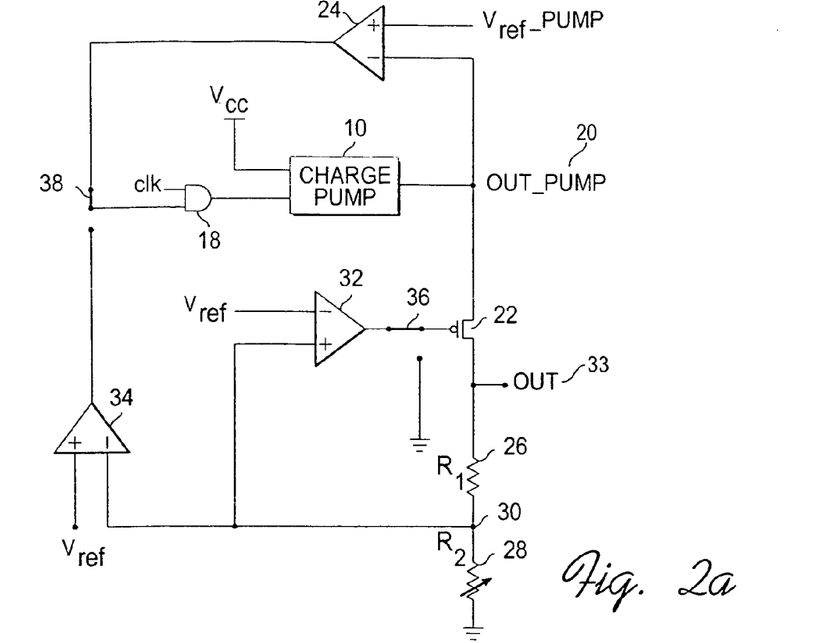
FIG. 2a is a circuit block diagram showing a first switching configuration of the circuit block diagram shown in FIG. 1 whereby a highly stable and precise voltage output is achieved.

FIG. 2a shows the switching position for a high precision voltage output mode. In FIG. 2a, the first two-way switching means 36 is shown connecting the output of the second op amp 32 to the gate of the PMOS transistor 22. The second switching means 38 connects the output of the first op amp 24 to the first input terminal of the AND gate 18. In this configuration, the feedback loop consists of the voltage divider formed by R1 26 and R2 28, the second op amp 32, and PMOS transistor 22. The voltage output ($V_{out}$) level is controlled by the setting of the variable resistor R2 28 as determined in the following formula:

$$V_{out} = V_{ref} * \left(1 + \frac{R_1}{R_2}\right) \quad \text{(Eq. 1)}$$

The second op amp 32 compares the voltage at the center_tap 30 of the voltage divider to the reference voltage $V_{ref}$ and presents a signal proportional to their difference at the gate of the PMOS transistor 22. If the voltage at the center_tap 30 of the voltage divider is greater than the reference voltage $V_{ref}$, the second op amp 32 output voltage would be increased, thereby reducing the conductivity of the PMOS transistor 22, and restoring the voltage at the voltage output terminal OUT 33 to the desired value. Similarly, if the voltage at the center_tap 30 of the voltage divider is less than the reference voltage $V_{ref}$, output voltage of the second op amp 32 reduces, thereby increasing the conductivity of the PMOS transistor 22 and restoring the desired voltage at the voltage output terminal OUT 33.

Figure 2B:
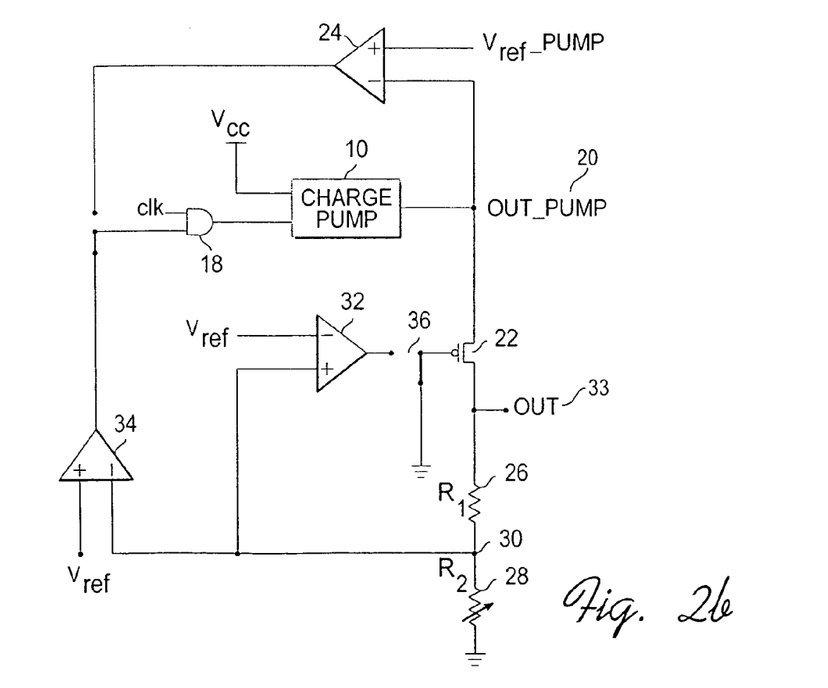
FIG. 2b is a circuit block diagram showing a second switching configuration of the circuit block diagram shown in FIG. 1 whereby a low current consuming voltage output is achieved.

FIG. 2b shows the switch positions for a low current consumption mode. In the figure, the first two-way switching means 36 connects the gate of the PMOS transistor 22 to ground, thereby providing a direct electrical connection between the output 16 of the charge pump 10 and the voltage output terminal OUT 33. The feedback loop consists of the voltage divider form by R1 26 and R2 28, the third op amp 34, and the two-input AND gate 18. The third op amp 34 compares the voltage at the center_tap 30 of the voltage divider to the reference voltage $V_{ref}$ and produces a digital signal equal to Vcc if $V_{ref} > V_{center\_tap}$ or equal to ground if $V_{ref} < V_{center\_tap}$ and presents the digital signal at the first input of the AND gate 18. This signal from the third op amp 34 dictates whether the clock signal clk, which is used by the charge pump 10 to raise the voltage at its OUT-PUMP node 20, feeds the charge pump or not. If the voltage at the center_tap 30 of the voltage divider is more than or equal to the reference voltage $V_{ref}$, then, the third op amp 34 presents a logic low at its output, thereby preventing the clock signal clk from reaching the charge pump 10. If, on the other hand, the voltage at the center_tap 30 of the voltage divider is less than that of the $V_{ref}$, an assertive signal would be produced at the output of the third op amp 34, thereby allowing the clock signal at the second input of the AND gate 18 to reach the charge pump 10, which in turn raises the voltage at the charge pump output out-pump to its desired voltage.

The switches between the two feedback pathways can be facilitated by comparing the voltage output at the voltage output terminal OUT 33 with a voltage set point (Vs), which depends on the application. In a typical design, the set point is 8V. Below 8V, a more accurate output voltage is usually needed. Above 8V, the "phase stopping" regulation is preferred, since the major issue is the low current consumption. In one embodiment, the $V_{out}$ can be encoded into a binary number and it is compared with a binary set point Vs. If $V_{out}$ is less than Vs, the two-way switching means are configured as it is shown in FIG. 2a to provide a high precision voltage output. If $V_{out}$ is greater than Vs, the two-way switching means are configured as it is shown in FIG. 2b to reduce current consumption.

Although a PMOS transistor is used as a pass device in the above described embodiment, an NMOS transistor with its drain connected to the OUT-PUMP node 20 and its source connected to the OUT node 33, can also be used. There is the great advantage associated with the use of a PMOS transistor. For instance, it provides a very low voltage drop across its channel without any boost of the gate voltage. In fact, for a given $V_{out}$ voltage, the greater the load current, the lower the gate voltage. For extremely high load currents (particularly when $V_{out}$ is a high value), the PMOS transistor will eventually exit out of the saturation region, and enter the linear region, with the voltage gate lowering towards ground potential. The maximum voltage involved in the structure is the source voltage, which is the voltage at the OUT-PUMP node 20. Hence, $V_{out}$ could be regulated near $V_{out-pump}$ value, without any voltage boost over the $V_{out-pump}$ value. If a NMOS transistor is used, in similar conditions (high $V_{out}$ values with huge load currents), the gate voltage must be at least one threshold voltage above the $V_{out}$ value: $V_g > V_{out} + V_{th}$. If $V_{out}$ has to be regulated near the $V_{out-pump}$ value, a boost on the gate voltage over the $V_{out-pump}$ value is needed. So, for a given $V_{out}$ level, the maximum voltage involved in the structure with PMOS transistor is lower than the maximum voltage involved in the structure with the NMOS transistor. Since this voltage is furnished by the charge pump, an oversizing of the NMOS transistor is needed compared to the PMOS transistor case.

Figure 3A:
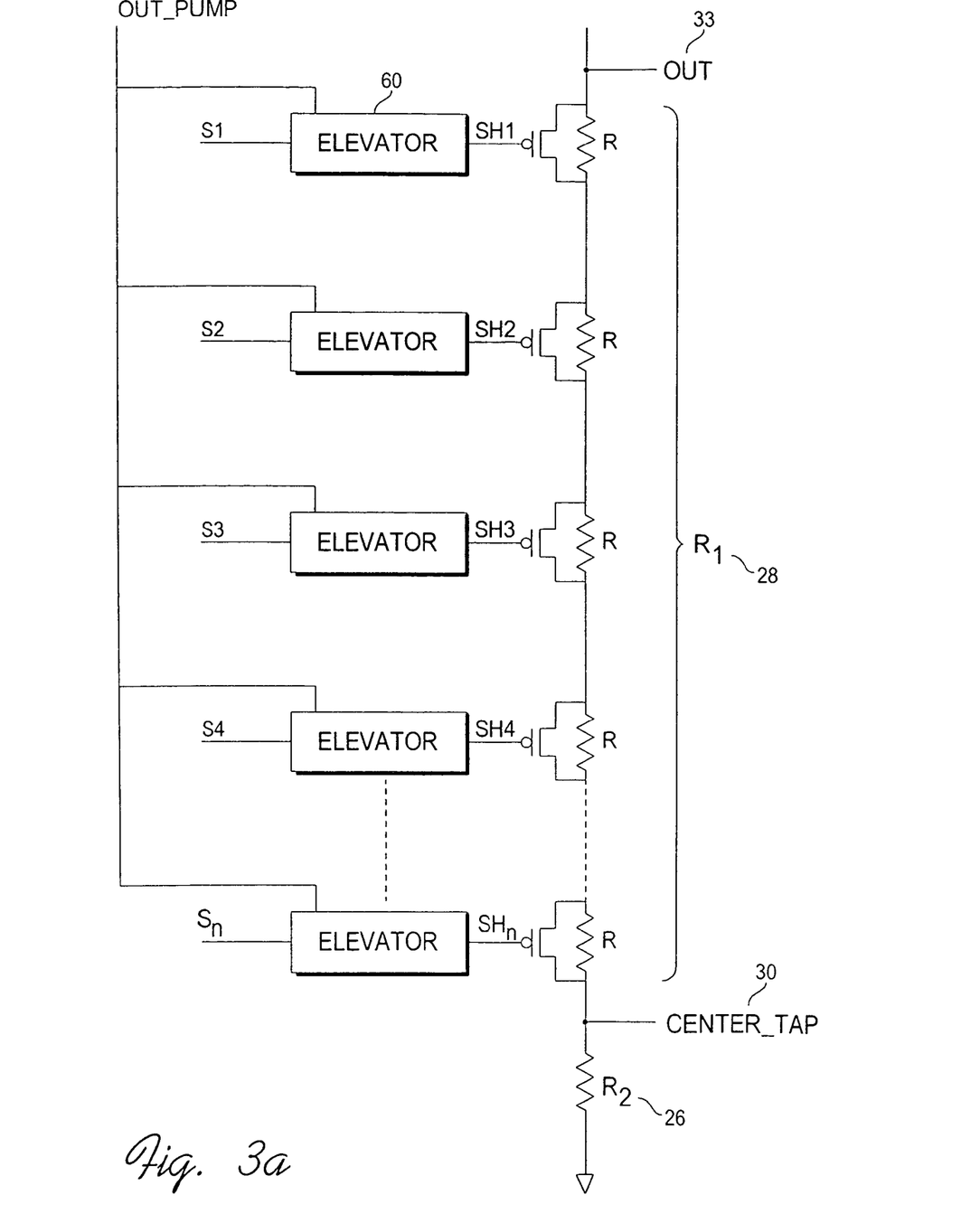
FIG. 3a shows a circuit diagram for an embodiment with a variable R1 resistor.

As shown in Equation 1, the output voltage $V_{out}$ at the voltage output terminal OUT 33 is affected by both R1 and R2. In the above-described embodiment, R1 is fixed while R2 varies. It is also conceivable to have R2 fixed and R1 varies as it is shown in FIG. 3a. In the figure, R1 is composed of a series of resistors with the value R. The value of R1 is determined by cutting or adding these resistors R from the resistor chain using a series of PMOS transistors 62. The advantage of having a tunable R1 is that the bias current of the PMOS transistor is dictated by the equation: $i_{bias} = V_{ref}/R2$. This is an advantage in terms of loop compensation (the PMOS transistor has a fixed bias current in no-load conditions). The relation between $V_{out}$ and R1 is linear, so equal increments in $V_{out}$ correspond to equal increments in R1 value. This is an advantage from the layout and reliability point of view as well.

On the other hand, the signals SH1–SHn which in turns cut or add a resistive portion to R1 must be referred to $V_{out}$ or $V_{out-pump}$ level, not Vcc. Otherwise, the switches 62 wouldn't be well close or open. Hence, dedicated circuits, such as elevators 60, that translate the digital control signals S1 into the $V_{out}$ (or $V_{out-pump}$) level signals SH1, are needed. These switches 62 must be high-voltage type, with reduced conductivity and greater occupied area.

Figure 3B:
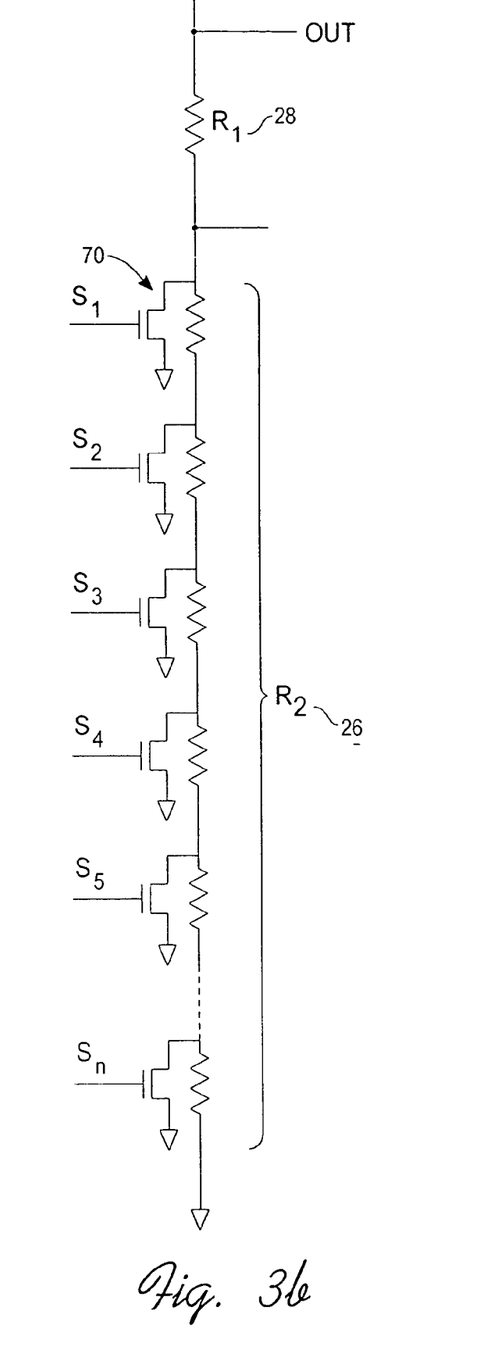
FIG. 3b shows a circuit diagram for an embodiment with a variable R2 resistor.

If R1 is fixed and R2 is tuned as it is shown in FIG. 3b, the bias current of the pass device is a function of the $V_{out}$ value: $i_{bias} = (V_{out} - V_{ref})/R1$. The lower $V_{out}$ is, the smaller $i_{bias}$. This could be a problem in terms of loop compensation and transient behavior of the circuit because of the slow discharge of the high capacitive nodes OUT 33 and center_tap with relatively small currents. But it can easily be overcome with a net that generates a variable load with the $V_{out}$ value as part of the function, in order to obtain a constant bias current. As the relation between $V_{out}$ and R2 26 is not linear, equal increments in $V_{out}$ don't correspond to equal increments in R2 26 value. Therefore, R2 26 is made of resistance module with different value from each other. The main advantage of this approach is that the n switches 70 can be referred to the Vcc level, since they bypass resistive portion towards ground. In this way no elevator circuit is needed to implement the Vcc-to-$V_{out}$ level translation, the switches 70 can be low voltage type, which takes up less area and offers greater conductivity.

Figure 4:
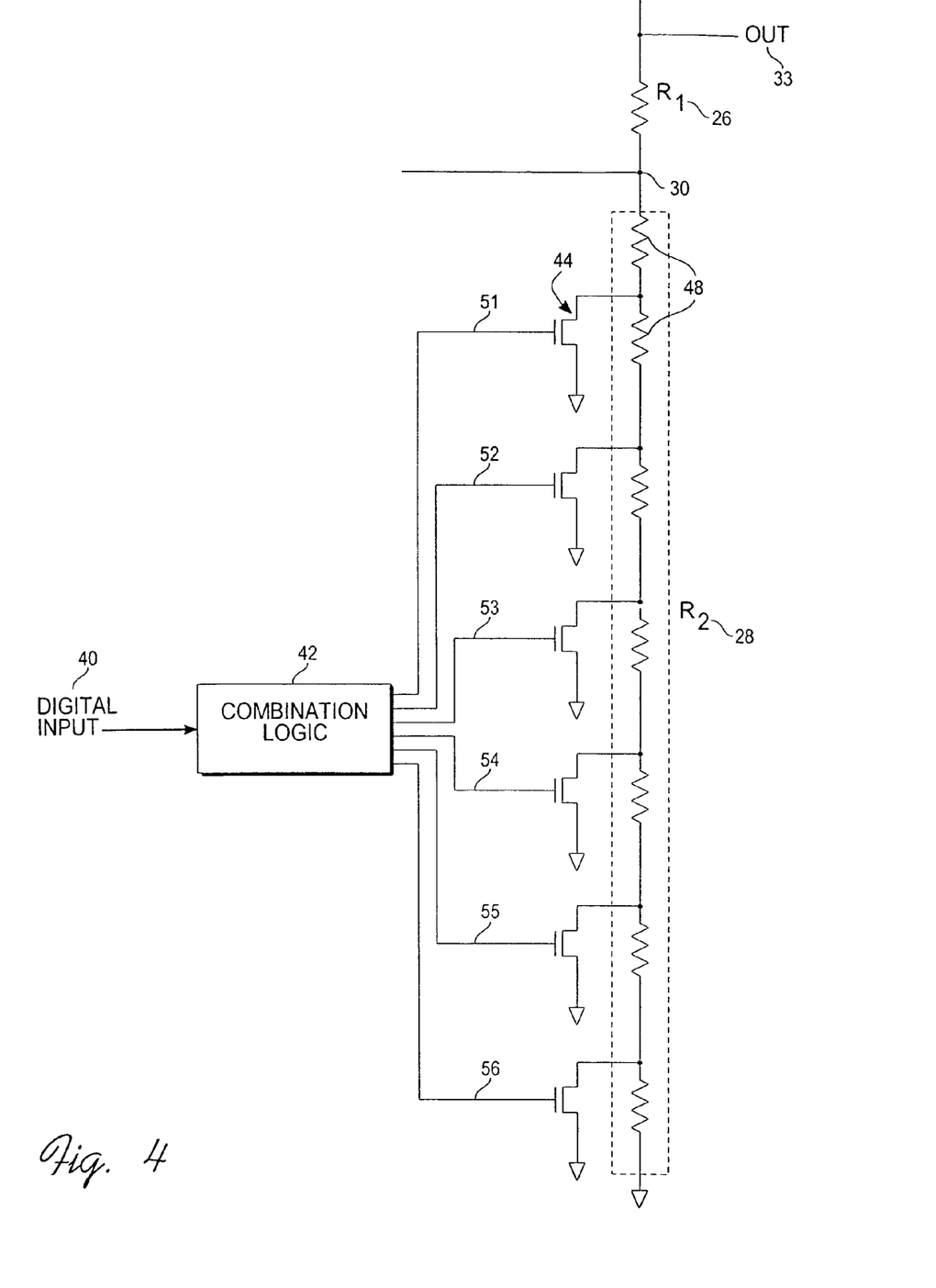
FIG. 4 is a circuit diagram showing a part of a digital-to-analog converter for converting a digital input into a plurality of voltage output levels.

The above-described circuit can be used as a digital-to-analog converter (DAC) that provides a multiplicity of output voltages with high precision on a wide range of current loads. FIG. 4 shows an input for such DAC. In the figure, a digital signal input line 40 connects to a combination logic circuit 42 that decodes the digital signal and issues an assertive signal to the gate of one of six pass gates 44 that connects one or more resistors 48 to ground. The number of voltage value to be regulated correlates to the number of pass gates 44. In this example, 6 pass gates are used, which provides 6 regulated voltage values. The series of resistors 48 forms the variable resistor R2 28. By turning the digital signal at the digital input line 40 to various R2 values, a plurality of analog voltage output can be realized at the voltage output terminal OUT 33.

In an actual implementation of the regulating circuit, the $V_{out-pump}$ voltage 20 is roughly regulated at different values, depending on the $V_{out}$ value. Different $V_{out-pump}$ values correspond to different ranges of $V_{out}$. This approach reduces consumption from the OUT-PUMP node 20 and Vcc supply, and reduces the electrical stress across the pass device 22. If the charge pump 10 is left in a free running mode, an extremely high Vout-pump would appear on the source of the pass device 22, even when a low $V_{out}$ is regulated. As a result, breakdown problems and stress problems would arise. The error amplifier 32 is supplied by the OUT-PUMP node 20. If a relatively high current is sunk from this node, the $V_{out-pump}$ voltage could be much different from the maximum voltage that the pump nominally furnishes (as known in literature, a charge pump has a Thevenin equivalent scheme with a voltage source VPO and a serial resistance Rs attached to the output node of the pump, where the Vpump voltage is measured. VPO is the voltage with no load consumption. Once the load current is fixed, the maximum Vpump voltage is determined by VPO and Rs). This fact could cause difficulties in sizing and controlling the stability of the error amplifier 32, since its supply level could be not be accurately determined. Besides this fact, a bigger current consumption would be observed from the supply Vcc. Furthermore, a high $V_{out-pump}$ with a low $V_{out}$ causes stability problems strictly related to the pass device 22. The number of $V_{out-pump}$ roughly regulated voltages is a tradeoff between current consumption, stability and transient considerations.

Figure 5:
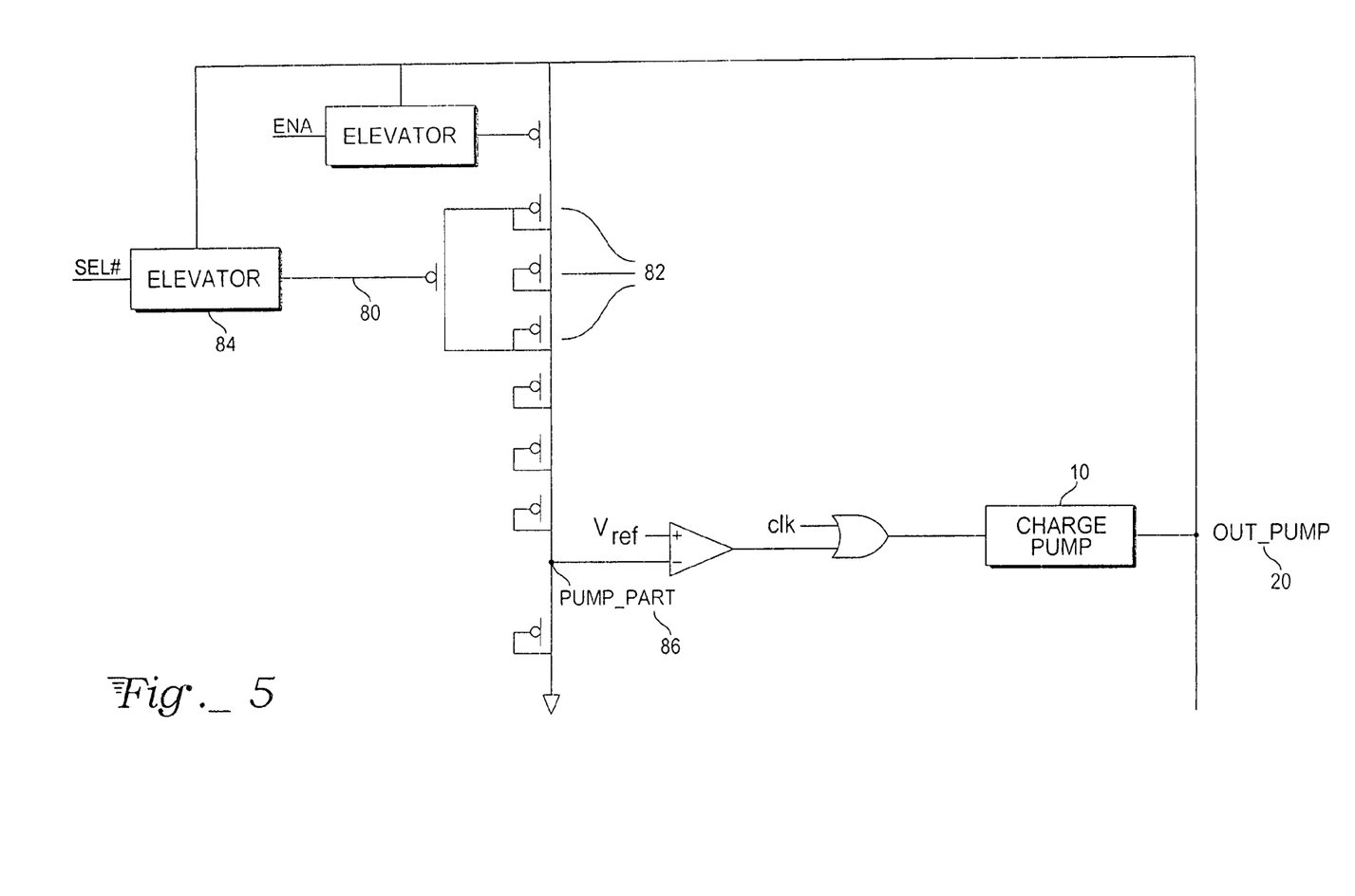
FIG. 5 shows an embodiment of a diode chain for the rough regulation of the Vpump-part voltage.

It is also possible to reduce the number of op amps used by combining the function of first op amp 24 and the third op amp 34. As schematically depicted in FIG. 2a, $V_{out-pump}$ is compared with a $V_{ref-pump}$ voltage at the input of the first op amp 24. The output of the first op amp 24 enables the clock clk to feed the charge pump 10. This net can be implemented in different ways. Instead of using a $V_{ref-pump}$ different from $V_{ref}$ voltage, the inputs of the first op amp 24 could be $V_{ref}$ and a partition of the $V_{out-pump}$ voltage. It is important that this partition net doesn't sink too much current from the OUT-PUMP node so as to maintain low current consumption from the pump. Since this can be roughly regulated, a simple diode chain 82 can be used to obtain the $V_{pump-part}$ voltage, as depicted in FIG. 5. Moreover, with this simple net $V_{out-pump}$ can be easily tuned at different values by the high voltage switches 80 that bypass some diodes 82 of the chain. The switches 80 are gated by signals that refer to $V_{out-pump}$ level, derived by means of ELEVATOR blocks 84 from logic signals SEL#. The first op amp switches when $V_{pump-part}$ 86 is equal to $V_{ref}$. In this situation, if the diodes are equal to each other, each diode has a Vgs equal to $V_{ref}$. Suppose d is the number of diodes connected between the OUT-PUMP node 20 and the PUMP_PART node 86, the regulated $V_{out-pump}$ voltage is [$V_{out-pump}$=(d+1)*$V_{ref}$.] $V_{out-pump}$ is then a multiple of the $V_{ref}$ voltage.

It is also desirable to have an additional circuit controlling the short between OUTPUMP and OUT to avoid undesirable ripples at the OUT node 33 during the switching from one feedback pathway to another. A control circuit, like one shown in FIG. 6, would discharge the voltage at the OUT node 33 during a switch over until the $V_{out}$ is equal to $V_{out-pump}$.

Figure 6:
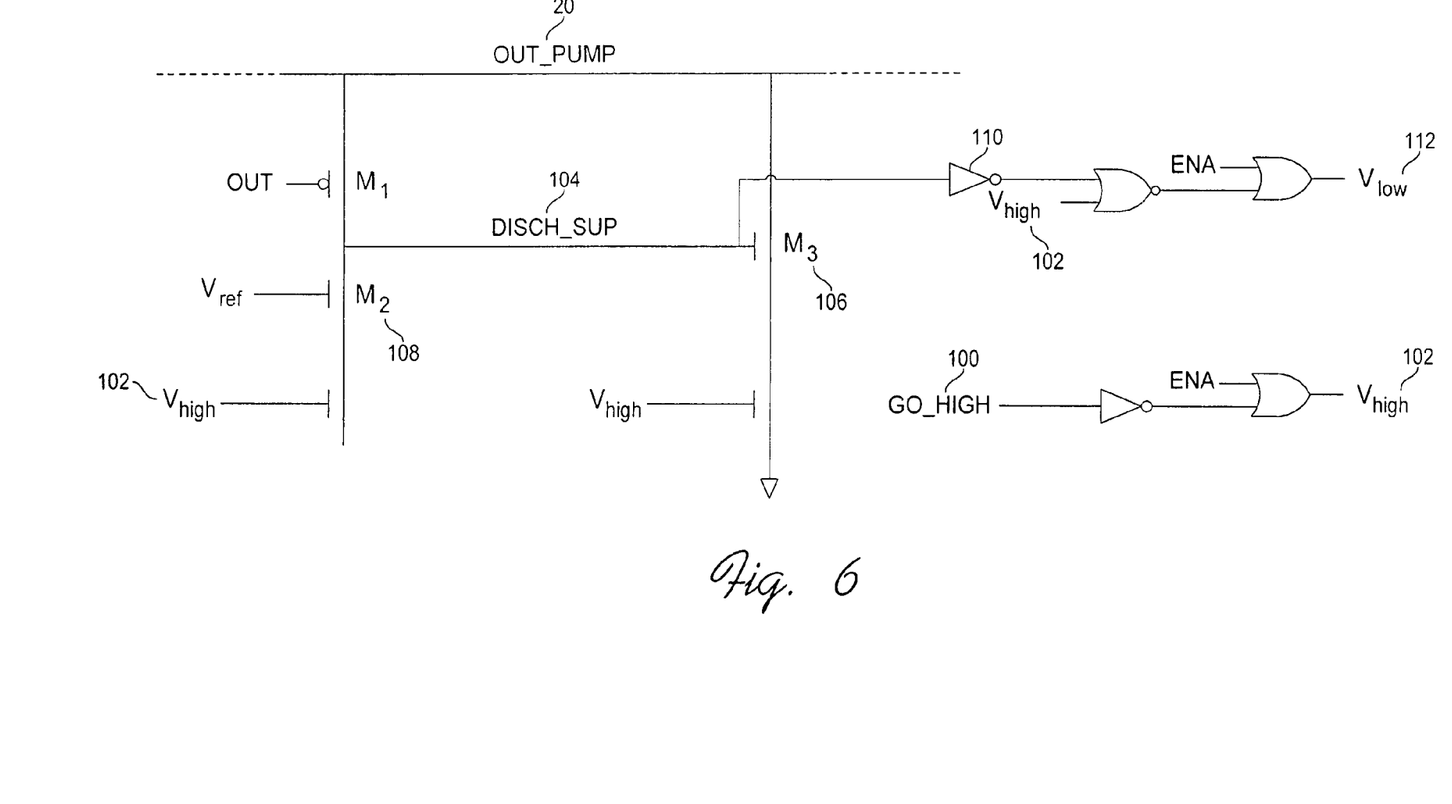
FIG. 6 shows a discharging circuit for the switching from one feedback path to the next.

As shown in FIG. 6, when the decoded $V_{out}$ is greater than Vs, the GO_HIGH signal 100 at high level makes $V_{HIGH}$ 102 go high. With $V_{HIGH}$ 102 at high level, the discharge circuit is enabled. Unless $V_{out-pump}$>($V_{out}$+$V_{th\_M1}$), DISCH_SUP 104 is kept high, and M3 106 on, in order to continue discharging OUT-PUMP node. When $V_{out-pump}$ 20 decreases at values near ($V_{out}$+$V_{th\_M1}$), the current of M2, gated by $V_{ref}$ and acting as current generator, starts discharging DISCH_SUP node 104, turning off M3 and stop discharge phase of OUT-PUMP node. When DISCH_SUP 104 voltage decreases to under the trigger point of a first inverter, the signal $V_{LOW}$ 112 goes low.

$V_{HIGH}$ 102 at high level disconnects the input of the first comparator from PUMP_PART 86 and connects it to the center_tap node 30. $V_{LOW}$ 112 at high level enables the error amplifier 32. $V_{LOW}$ at low level disables the error amplifier 32 and shorts the gate of the pass device 22 to ground, and consequently shorts OUT-PUMP 20 to OUT 33. Once the discharge of OUT-PUMP node 20 is terminated, the regulation of the $V_{out}$=$V_{out-pump}$ voltage is achieved by properly stopping the clock clk that feeds the charge pump.

We claim:

1. A direct current voltage regulator circuit comprising:
   a first operational amplifier configured to function as a comparator, the first operational amplifier having a first input, a second input, and an output, the first input of the first operational amplifier configured to be coupled to an output of a voltage generator and the second input of the first operational amplifier configured to be coupled to a reference voltage;
   a logic gate, the logic gate having a first input, a second input, and an output, the output of the operational amplifier being configured to be coupled to the first input of the logic gate, the second input of the logic gate being configured to be coupled to a clock signal, and the output of the logic gate being configured to enable or disable the application of the clock signal to the voltage generator;
   a current control device having a source terminal, a sink terminal, and a control terminal, the current control device source terminal being configured to be coupled to the output of the voltage generator;
   a second operational amplifier, the second operational amplifier having a first input, a second input, and an output, the first input of the second operational amplifier being coupled to the current control device sink terminal, the second input of the second operational amplifier being configured to be coupled to a second reference voltage and the output of the second operational amplifier being configured to be coupled to the current control device control terminal; and
   a control switching device, the control switching device having a first input terminal, a second input terminal, and an output terminal, the first input of the control switching device being coupled to the output of the second operational amplifier and the output terminal of the control switching device being coupled to the control terminal of the current control device.

2. The circuit of claim 1 further comprising a voltage divider, the voltage divider being configured to divide the output voltage of the voltage generator and a reference voltage, the voltage divider being further configured to supply a plurality of output voltages through a plurality of output taps, a first one of the plurality of output taps being coupled to the first input of the first operational amplifier.

3. The circuit of claim 2, wherein the voltage divider comprises a plurality of resistors, at least one of the plurality of resistors being coupled in parallel with a bypass device, the bypass device adapted to allow the at least one of the plurality of resistors to be selectively bypassed.

4. The circuit of claim 2, wherein the voltage divider comprises a plurality of diodes, at least one of the plurality of diodes being coupled in parallel with a bypass device, the bypass device adapted to allow the at least one of the plurality of diodes to be selectively bypassed.

5. The circuit of claim 1 further comprising a third operational amplifier, the third operational amplifier being configured to function as a comparator, the third operational amplifier having a first input, a second input, and an output, the first input of the third operational amplifier being coupled to the current control device sink terminal, the second input of the third operational amplifier being configured to be coupled to a reference voltage, and the output of the third operational amplifier being configured to be coupled to the first input of the logic gate.

6. The circuit of claim 5 further comprising a logic gate switching device having a first input terminal, a second input terminal, and an output terminal, the first input terminal of the logic gate switching device being coupled to the output of the first operational amplifier, the second input terminal of the logic gate switching device being coupled to the output of the third operational amplifier, and the output terminal of the logic gate switching device being coupled to the first input of the logic gate.

7. The circuit of claim 1 wherein the second input of the control switching device is coupled to a second reference voltage.

8. The circuit of claim 1, wherein the second input of the control switching device is configured to be coupled to the output of the voltage generator.

9. The circuit of claim 1, further comprising a voltage divider, the voltage divider configured to supply a plurality of output voltages through a plurality of output taps, a first one of the plurality of output taps being coupled to the first input of the first operational amplifier, the voltage divider being further configured to couple the current control device sink terminal to a reference voltage.

10. The circuit of claim 9, wherein the voltage divider comprises a plurality of resistors, at least one of the plurality of resistors being coupled in parallel with a bypass device, the bypass device adapted to allow the at least one of the plurality of resistors to be selectively bypassed.

11. The circuit of claim 9, wherein the voltage divider comprises a plurality of diodes, at least one of the plurality of diodes being coupled in parallel with a bypass device, the bypass device adapted to allow the at least one of the plurality of diodes to be selectively bypassed.

* * * * *